(12) United States Patent
Murakoshi

(10) Patent No.: US 6,619,967 B2
(45) Date of Patent: Sep. 16, 2003

(54) CONNECTING STRUCTURE OF ELECTRICAL COMPONENT TO ELECTRICAL JUNCTION BOX

(75) Inventor: Hiroyuki Murakoshi, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/003,111

(22) Filed: Dec. 6, 2001

(65) Prior Publication Data

US 2002/0076955 A1 Jun. 20, 2002

(30) Foreign Application Priority Data

Dec. 14, 2000 (JP) .................... P2000-380232

(51) Int. Cl.[7] .............................. H01R 9/09
(52) U.S. Cl. ....................... 439/76.2; 439/83
(58) Field of Search ................ 439/76.2, 621, 439/622, 682, 949, 723, 83, 876, 874, 875

(56) References Cited

U.S. PATENT DOCUMENTS

| 4,962,585 A | * | 10/1990 | Kobayashi ............... 29/885 |
| 5,241,134 A | * | 8/1993 | Yoo ...................... 174/94 |
| 5,508,476 A | * | 4/1996 | Dickenson ............... 174/261 |
| 5,928,035 A | | 7/1999 | Jankowsky et al. |
| 6,102,748 A | | 8/2000 | Lee et al. |
| 6,116,494 A | | 9/2000 | Brown et al. |
| 6,270,360 B1 | * | 8/2001 | Yanase ................. 439/76.2 |

FOREIGN PATENT DOCUMENTS

| EP | 1 037 312 | 9/2000 |
| JP | 05-299003 | * 12/1993 |

OTHER PUBLICATIONS

European Search Report, Annex.

* cited by examiner

*Primary Examiner*—P. Austin Bradley
*Assistant Examiner*—Phuongchi Nguyen
(74) *Attorney, Agent, or Firm*—Finnegan, Henderson, Farabow, Garrett, & Dunner, L.L.P.

(57) ABSTRACT

A connecting structure (23) of an electrical component to an electrical junction box, includes a plurality of long terminals (31) provided on the electrical component (29), and a flat plate-like bus bar (33) which is provided in the electrical junction box (27) to which the electrical component (29) is to be connected, the bus bar (33) being brought into conduction with the terminals (31) in a state in which the electrical component (29) is connected to the electrical junction box (27), a plurality of contact portions (35) formed by bending tip ends of the plurality of terminals (31) toward an outer periphery of the electrical component (29), the contact portions (35) being formed on front ends of the terminals (31) in a connecting direction of the electrical component (29) to the electrical junction box (27), the contact portions (35) being contacted with the bus bar (33) in the state in which the electrical component (29) is connected to the electrical junction box (27), and welding (37) for holding a contacted state between the plurality of contact portions (35) and the bus bar (33).

7 Claims, 4 Drawing Sheets

FIG.2A
FIG.2B
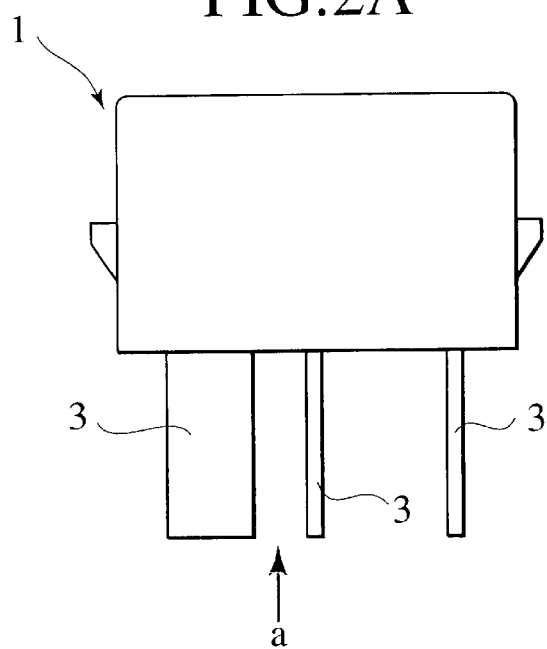
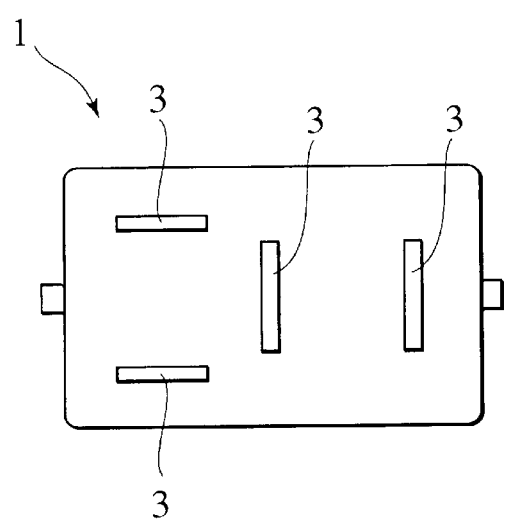
FIG.3
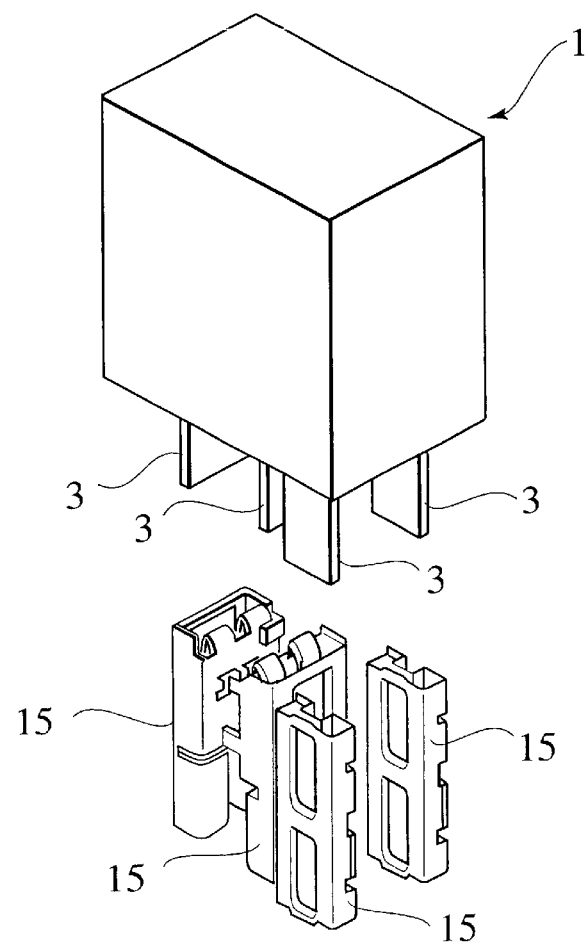

CONNECTING STRUCTURE OF ELECTRICAL COMPONENT TO ELECTRICAL JUNCTION BOX

BACKGROUND OF THE INVENTION

1. Field of the Invention

The present invention relates to a connecting structure of an electrical component to an electrical junction box for connecting the electrical component to a bus bar of the electrical junction box to form a circuit.

2. Description of the Related Art

There is a proposed connecting structure of an electrical component to an electrical junction box as shown in FIGS. 1 to 3. The connecting structure has a plurality of long terminals 3 projecting from an electrical component 1, and a flat-plate like bus bar 7 provided in an electrical junction box 5 to which the electrical component 1 is connected. The electrical component 1 used in this connecting structure 23 comprises a relay or the like. As shown in FIGS. 1, 2A and 2B, the plurality of long terminals 3 are outwardly extended from the circuit provided inside.

The electrical junction box 5 has a case 13 including a case 13 having a connecting portion 11 to which the electrical component 1 is to be connected, and a bus bar 7 accommodated in the case 13. A connecting portion 11 formed in the case 13 accommodates a plurality of junction terminals 15, and when the electrical component 1 is connected to the connecting portion 11, the plurality of terminals 3 are introduced into the connecting portion 11.

The bus bar 7 is formed by stamping a conductive metal plate into a predetermined shape. The bus bar 7 is sandwiched between insulating plates 17 and 19 so that opposite sides of the bus bar 7 insulated. A plurality of tabs 21 project from predetermined positions of the bus bar 7 in accordance with a circuit design, and each tab 21 passes through the insulating plate 17. The tabs 21 are disposed in the connecting portion 11 of the electrical junction box 5, and are connected to one side of the junction terminals 15 in its longitudinal direction.

In the case of the above-described connecting structure 23, as shown in FIG. 1, when the electrical component 1 and the electrical junction box 5 are connected to each other, the electrical component 1 is connected to the connecting portion 11 of the electrical junction box 5. At that time, in the electrical component 1 as shown in FIG. 3, the plurality of terminals 3 are introduced into the connecting portion 11 (not shown), the plurality of terminals 3 are respectively connected to the other ends of the plurality of junction terminals 15 accommodated in the connecting portion 11 in the longitudinal direction. As a result, in this connecting structure 23, the terminals 3 of the electrical component 1 and the bus bar 7 of the electrical junction box 5 are brought into conduction with each other through the junction terminals 15.

However, according to the proposed connecting structure 23 of the electrical component to the electrical junction box, when the electrical component 1 is connected to the electrical junction box 5, the terminals 3 of the electrical component 1 and the tabs 21 of the bus bar 7 of the electrical junction box 5 are connected to each other through the junction terminals 15. Therefore, the number of parts of the connecting structure 23 is increased, and the producing cost thereof is also increased.

Further, in the connecting structure 23, since the junction terminals 15 is accommodated in the connecting portion 11 of the electrical junction box 5 to which the electrical component 1 is to be connected, the electrical junction box 5 must be increased in size by the size of the connecting portion 11 and the junction terminals 15, and the connecting structure 23 is increased in size and weight as a whole.

Further, when the bus bar 7 is formed, the tabs 21 are formed by stamping developed tabs 21 together with the bus bar 7 and then, the tabs 21 are projected from the bus bar 7. Therefore, the bus bar 7 is formed by stamping the metal plate such that the tabs 21 are avoided.

Thus, in the connecting structure 23, the yield of the bus bar 7 is deteriorated, and the producing cost is increased.

SUMMARY OF THE INVENTION

Thereupon, it is an object of the present invention to provide a connecting structure of an electrical component to an electrical junction box, capable of reducing the producing cost and reducing both size and weight.

To achieve the above object, a first aspect of the present invention provides a connecting structure of an electrical component to an electrical junction box, comprising a plurality of long terminals provided on the electrical component, a flat plate-like bus bar which is provided in the electrical junction box to which the electrical component is to be connected, the bus bar being brought into conduction with the terminals in a state in which the electrical component is connected to the electrical junction box, a plurality of contact portions formed by bending tip ends of the plurality of terminals toward an outer periphery of the electrical component, the contact portions being formed on front ends of the terminals in a connecting direction of the electrical component to the electrical junction box, the contact portions being contacted with the bus bar in the state in which the electrical component is connected to the electrical junction box, and holding means for holding a contacted state between the plurality of contact portions and the bus bar.

According to this first aspect, when the electrical component is connected to the electrical junction box, the contact portions of the plurality of terminals are brought into contact with the bus bar, and the contacted state between the contact portions and the bus bar is held by the holding means.

According to a second aspect of the invention, in the connecting structure of an electrical component to an electrical junction box of the first aspect, the holding means tightly connecting the contacted portions between the contact portions and the bus bar in the state in which the electrical component is connected to the electrical junction box.

With the second aspect, in the state in which the electrical component is connected to the electrical junction box, the contacted portions of the end surfaces of the contact portions of the plurality of terminals and the outer surface of the bus bar is tightly connected by the holding means. Therefore, the bus bar and the plurality of terminals can be secured reliably.

A third or fourth aspect of the invention, in the connecting structure of an electrical component to an electrical junction box of the first or second aspect, the plurality of contact portions are formed by bending the terminals in a direction intersecting a projecting direction of the electrical component toward the electrical junction box, end surfaces formed on front ends of the terminals in the projecting direction are brought into contact with the outer surface of the bus bar in the state in which the electrical component is connected to the electrical junction box.

With the third or fourth aspect, the contact portions of the terminals formed in the direction intersecting the projecting direction from the electrical component bring the end surfaces formed on the front ends of the terminals into contact with the outer surface of the bus bar in the state in which the electrical component is connected to the electrical junction box.

BRIEF DESCRIPTION OF THE DRAWINGS

FIG. 2A is a front view of the electrical component shown in FIG. 1, and FIG. 2B is a plan view of FIG. 2A as viewed form an arrow a in FIG. 2A;

FIG. 3 is a perspective view when junction terminals and electrical component are connected to each other shown in FIG. 1;

DETAILED DESCRIPTION OF THE PREFERRED EMBODIMENTS

An embodiment of a connecting structure of an electrical component to an electrical junction box of the present invention will be explained below.

Figure 1:
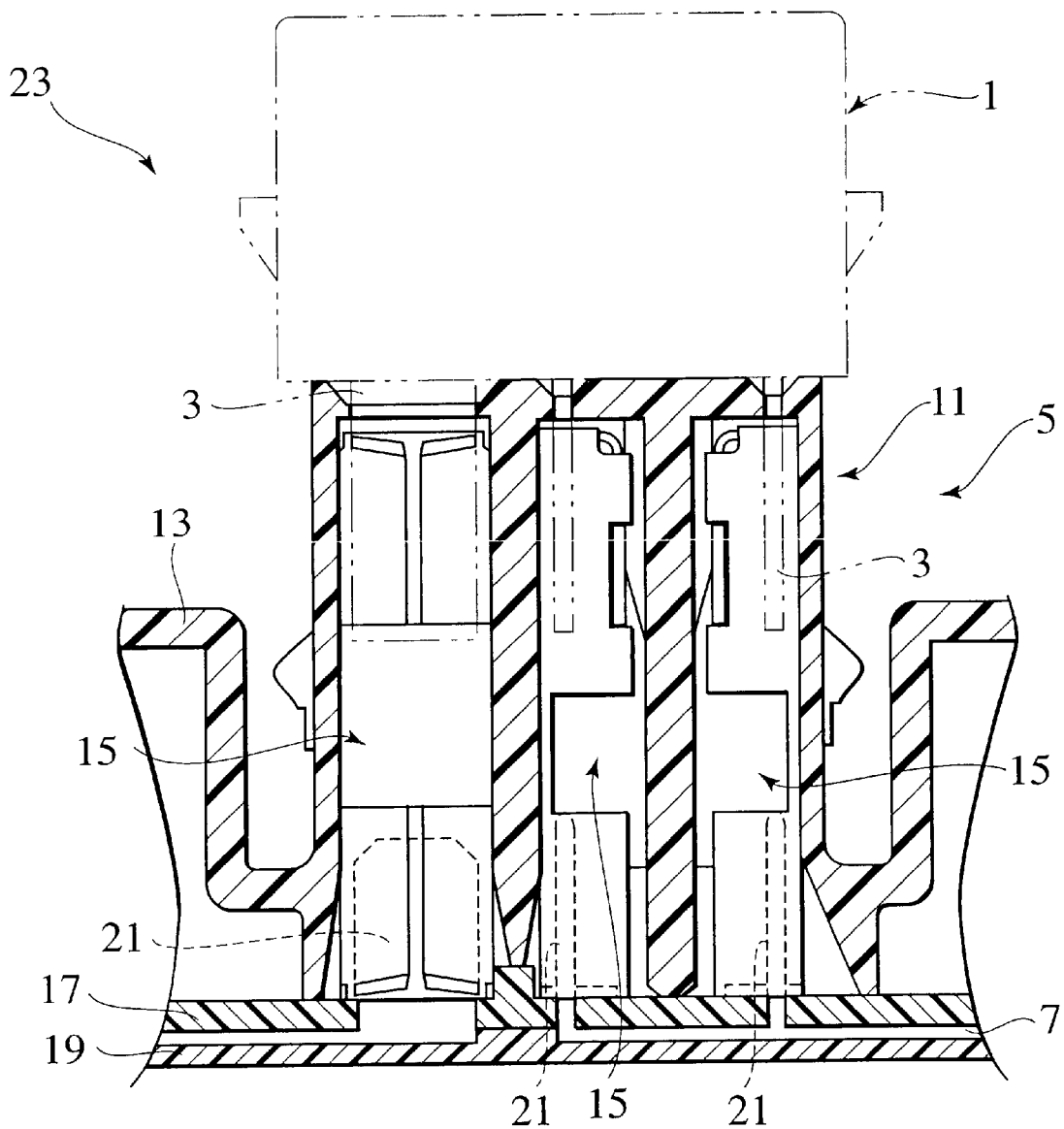
FIG. 1 is a sectional view showing a proposed connecting structure of an electrical component to an electrical junction box.
Figure 4:
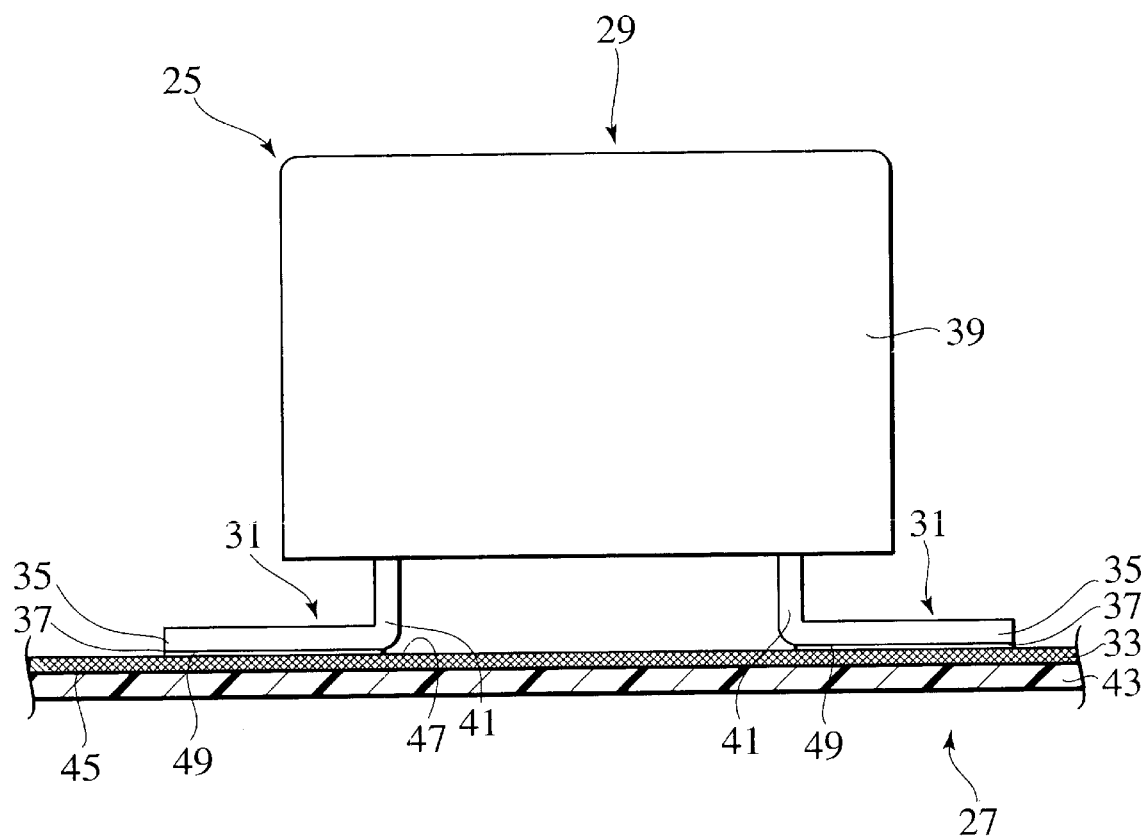
FIG. 4 is a sectional view showing a connecting structure of an electrical component to an electrical junction box according to the present invention.

As shown in FIG. 4, in a connecting structure 25 of the electrical component to the electrical junction box, an electrical component 29 is accommodated in an electrical junction box 27 and connected to the electrical junction box 27. The connecting structure 25 comprises a plurality of terminals 31 provided on the electrical component 29 and a bus bar 33 provided in the electrical junction box 27, a plurality of contact portions 35 respectively formed on the plurality of terminals 31 and contacting with the bus bar 33, and holding means 37 for keeping the contact state between the contact portions 35 and the bus bar 33.

Figure 5:
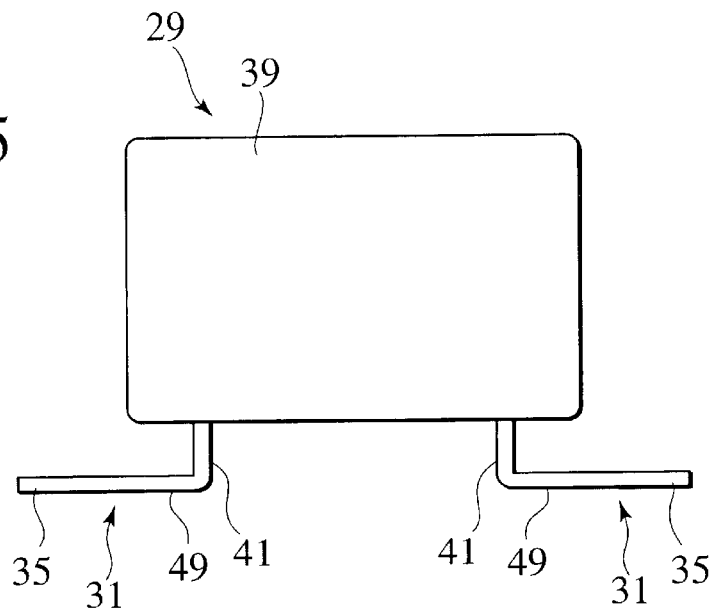
FIG. 5 is a front view of the electrical component shown in FIG. 4.

As shown in FIGS. 4 and 5, the electrical component 29 includes a part body 39 comprising a relay and formed with a circuit (not shown), and a plurality of terminals 31 projecting from the part body 39.

Each of the plurality of terminals 31 comprises a long conductive metal plate. One end of the terminals 31 in their longitudinal direction are connected to the circuit in the part body 39, and the other end, i.e., tip ends of the terminals 31 outwardly project from the part body 39. Sizes in the longitudinal direction of portions of the plurality of terminals 31 projecting from the part body 39 are substantially the same, and a widthwise size of each the terminal 31 is set in accordance with permissible current determined by specification of the electrical component 29. The other end of each terminal 31 in its longitudinal direction is bent at a predetermined position projecting from the part body 39 toward the outer peripheral side of the part body 39 in the longitudinal direction. One side of the terminal 31 from its bent portion is a terminal body 41, and the other side from the bent portion of the terminal 31 is the contact portion 35.

Each of the terminal bodies 41 is formed into a rectangular plate-like shape, and projects in a connecting direction of the electrical component 29 to the electrical junction box 27 from the part body 39 by a predetermined distance. The terminal body 41 is provided at its front end in its projecting direction from the part body 39 with the contact portions 35.

Figure 6:
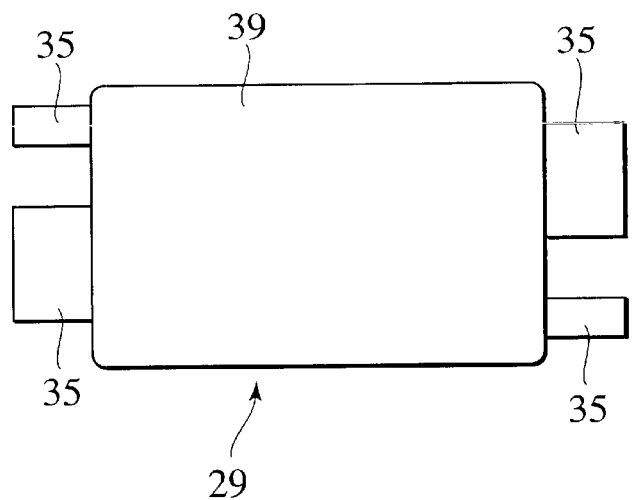
FIG. 6 is a plan view of the electrical component shown in FIG. 4.

The contact portion 35 is formed into a rectangular plate-like shape, and is formed in a direction intersecting with the projecting direction from the terminal body 41, and the contact portions 35 is a front end of the terminal 31 in a connecting direction of the electrical component 29 to the electrical junction box 27 as a whole. One end of each of the contact portions 35 is integrally formed on the front end of the terminal body 41 in its projecting direction from the part body 39. As shown in FIGS. 4–6, the other side, i.e., the tip end of the terminal 31 is disposed outside the outer periphery of the part body 39. The end surface 49 of the contact portion 35 formed on the front end side in the projecting direction of the terminal body 41 is in contact with the outer surface 47 of the bus bar 33 in a state in which the electrical component 29 is connected to the electrical junction box 27.

Figure 7:
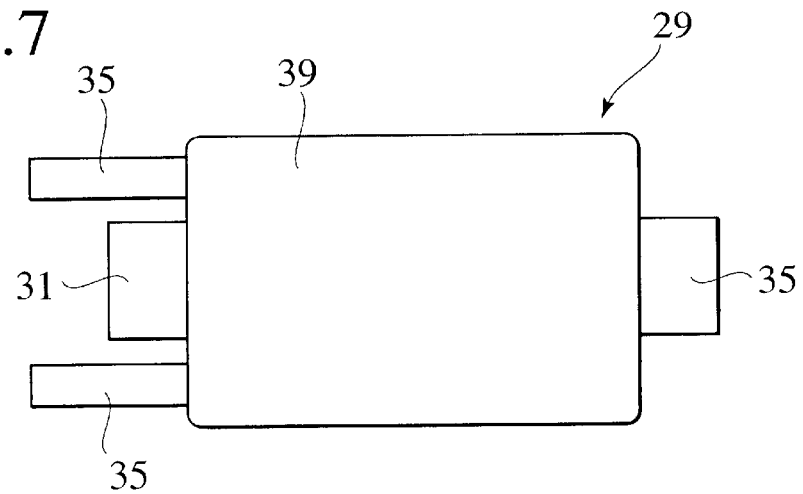
FIG. 7 is a plan view of another electrical component used for the connecting structure of the electrical component to the electrical junction box according to the present invention.

As shown in FIG. 7, in the electrical component 29, the bending directions of the plurality of terminals 31 are changed, and the positions of the other sides of the contact portions 35 in their longitudinal direction are appropriately changed depending upon the circuit design.

The electrical junction box 27 formed in this manner to which the electrical component 29 is connected comprises upper and lower cases coupled to each other to form a box-like shape, and a bus bar 33 accommodated in the upper and lower cases. The upper and lower cases are coupled to each other to form the box-like shape having a space therein. In a state in which the electrical component 29 is connected to the electrical junction box 27, the upper and lower cases accommodate the electrical component 29 together with the bus bar 33.

As shown in FIG. 4, the bus bar 33 is a flat plate-like shape, and is formed by stamping a conductive metal plate into a predetermined shape in accordance with the circuit design. The bus bar 33 is superposed on a plate-like insulating plate 43, and an inner surface 45 of the bus bar 33 which is in contact with the insulating plate 43 is tightly contacted with the insulating plate 43 and electrically insulated. An outer surface 47 of the bus bar 33 formed on the opposite side from the inner surface 45 is brought into contact with end surfaces 49 of the plurality of contact portions 35 of the electrical component 29 when the electrical component 29 is connected to the electrical junction box 27.

The above-described holding means 37 is formed by welding. In a state in which the electrical component 29 is connected to the electrical junction box 27, the holding means 37 tightly connects the end surfaces 49 of the plurality of contact portions 35 of the electrical component 29 and the outer surface 47 of the bus bar 33 of the electrical junction box 27 with each other. In this case, the holding means 37 is formed by resistance welding which welds the end surfaces 49 of the plurality of contact portions 35 and the outer surface 47 of the bus bar 33 using heat generated by electrical resistance, by ultrasonic welding which welds the end surfaces 49 of the plurality of contact portions 35 and the outer surface 47 of the bus bar 33 using heat generated by fine vibration caused by ultrasound, or by electron-beam welding which welds the end surfaces 49 of the plurality of contact portions 35 and the outer surface 47 of the bus bar 33 using heat generated by collision of electron beams.

The holding means may be formed by laser welding using a core material for connecting the outer periphery of the contact portion 35 and the outer surface 47 of the bus bar 33. Although the holding means of the present embodiment is formed by welding, the holding means may be formed by soldering.

The holding means of the present embodiment tightly connects the contact portion 35 and the bus bar 33, but the holding means may be formed of an accommodating portion formed into substantially the same shape as that of the part body 39 of the electrical component 29. In this case, in a state in which the electrical component 29 is connected to the electrical junction box, the part body 39 is accommodated in the accommodating portion, the part body 39 and the end surface 49 of the contact portion 35 are pressed by the inner peripheral surface of the accommodating portion and the outer surface 47 of the bus bar 33 to sandwich the electrical component 29, thereby positioning and fixing the electrical component 29 corresponding to the bus bar 33.

In the connecting structure 25 of the electrical component to the electrical junction box constructed as described above, as shown in FIG. 4, when the electrical component 29 is connected to the electrical junction box 27, the contact portions 35 of the plurality of terminals 31 of the electrical component 29 are first brought into contact with the bus bar 33 of the electrical junction box 27. Then, the contact state between the contact portions 35 of the plurality of terminals 31 and the bus bar 33 is held by the holding means 37. Thereafter, the electrical component 29 is accommodated into the electrical junction box 27 together with the bus bar 33.

When the contact portions 35 of the terminals 31 of the electrical component 29 and the bus bar 33 in the electrical junction box 27 are brought into contact with each other, the upper and lower cases of the electrical junction box 27 are previously brought into a developed state having an opening on the side of the outer surface 47 of the bus bar 33. In this state, the contact portions 35 of the plurality of terminals 31 of the electrical component 29 are aligned with predetermined positions of the bus bar 33 in accordance with the circuit design, and the electrical component 29 is moved toward the electrical junction box 27.

If the electrical component 29 is moved toward the electrical junction box 27, the end surfaces 49 of the plurality of contact portions 35 of the electrical component 29 are brought into contact with the outer surface 47 of the bus bar 33, and the plurality of terminals 31 of the electrical component 29 are brought into conduction with the bus bar 33 of the electrical junction box 27. At that time, sizes of the contact portions 35 of the plurality of terminals 31 are set into predetermined values, and the contact portions 35 are electrically connected with the bus bar 33 stably. The size of the contact portion 35 is adjusted in accordance with the permissible current by changing the bending position of each of the plurality of terminals 31. The contact state of the plurality of terminals 31 and the bus bar 33 is held by the holding means 37.

When the contact state of the contact portion 35 of the plurality of terminals 31 and the bus bar 33 is held by the holding means 37, portions between the contacted plurality of contact portions 35 and the bus bar 33 are welded. At that time, the electrical component 29 is pressed toward the bus bar 33 to bring the end surface 49 of the contact portion 35 and the outer surface 47 into contact with each other under pressure. In this state, the contacted portions between the end surfaces 49 of the contact portions 35 of the plurality of terminals 31 and the outer surface 47 of the bus bar 33 are heated.

As a result, the end surfaces 49 of the contact portions 35 of the plurality of terminals 31 and the outer surface 47 of the bus bar 33 are welded, and the holding means 37 are formed between the end surfaces 49 of the plurality of contact portions 35 of the plurality of terminals 31 and the outer surface 47 of the bus bar 33. Therefore, the plurality of contact portions 35 and the bus bar 33 are tightly connected to each other by the holding means 37.

In a state in which the plurality of contact portions 35 and the bus bar 33 are tightly connected to each other by the holding means 37, the electrical component 29 is fixed on the bus bar 33, and the contacted state between the plurality of contact portions 35 and the outer surface 47 of the bus bar 33 is held. Thus, the electrical component 29 and the bus bar 33 constitute a circuit.

The developed upper and lower cases are assembled, and a box-like body is formed by the upper and lower cases. In this state, the electrical component 29 and the bus bar 33 are surrounded by the upper and lower cases, the electrical component 29 is accommodated in the electrical junction box 27 together with the bus bar 33, and the electrical component 29 is connected to the electrical junction box 27.

According to the connecting structure 25 of the electrical component to the electrical junction box of this embodiment, the contact portions 35 of the plurality of terminals 31 are directly brought into contact and conduction with the bus bar 33, and the contacted state between the contact portions 35 and the bus bar 33 is held by the holding means 37. Therefore, according to this connecting structure 25, a junction terminal is not used for connecting the electrical component 29 to the electrical junction box 27 unlike the proposed art, the number of constituent parts of the electrical junction box 27 is reduced, the entire producing cost can be reduced, and it is possible to manage the parts easily.

According to the connecting structure 25 of the present embodiment, since the junction terminal is not used for connecting the plurality of terminals 31 of the electrical component 29 and the bus bar 33 of the electrical junction box 27, a portion for accommodating the junction terminal the junction terminal of the electrical junction box 27 is omitted.

Therefore, it is possible to reduce the size of the electrical component 29 into the connecting direction to the electrical junction box 27 by the sizes of the junction terminal and the portion for accommodating the junction terminal, and the amount of resin of the electrical junction box 27 can be reduced correspondingly to lower the cost, and the entire weight can also be reduced.

Further, according to this connecting structure 25, since the junction terminal is not used for connecting the plurality of terminals 31 of the electrical component 29 and the bus bar 33 of the electrical junction box 27, the junction terminal can be omitted, and the yield of the bus bar 33 can be enhanced without provided the bus bar 33 with a tab unlike the proposed art. As a result, the electrical junction box 27 can meet a complicated circuit, and the producing cost of the electrical junction box can be reduced.

According to the connecting structure 25, since the junction terminal is not used for connecting the plurality of terminals 31 of the electrical component 29 and the bus bar 33 of the electrical junction box 27, an apparatus for assembling the junction terminal into the electrical junction box 27 can be omitted, and the producing equipment cost of the electrical junction box 27 can be reduced.

Further, since the bus bar 33 is not formed with the tab unlike the proposed art, an operation for rising the tab after stamping the metal plate can be omitted, and the bus bar 33 can be produced easily. Therefore, the producing cost of the connecting structure 25 can be reduced.

In the connecting structure 25 of the present embodiment, the end surfaces 49 of the contact portions 35 of the plurality of terminals 31 are brought into contact with the outer surface 47 of the bus bar 33, and the contacted portions are tightly connected to each other by the holding means 37. Therefore, the bus bar 33 and the plurality of terminals 31 can be secured reliably. Thus, according to this connecting structure 25, the electrical component 29 can be connected to the electrical junction box 27 strongly, and the reliability of connection between the electrical component 29 and the electrical junction box 27 is enhanced.

In the connecting structure 25 of the present embodiment, the end surface 49 of the contact portion 35 formed by bending the terminal 31 in the direction intersecting the connecting direction of the electrical component 29 to the electrical junction box 27 is brought into contact with the outer surface 47 of the bus bar 33, and the terminal 31 and the bus bar 33 can be connected to each other with stable conductive state. Therefore, the size of the terminal body 39 in the projecting direction can be reduced, and the plurality of terminals 31 can be made small in the connecting direction of the electrical component 29 to the electrical junction box 27.

Therefore, in this connecting structure 25, the electrical component 29 can be made small in the connecting direction of the electrical component 29 to the electrical junction box 27, and the entire connecting structure 25 can be reduced in size, and when the electrical component 29 is mounted to a vehicle or the like, the space can be saved.

According to the connecting structure 25, when the electrical junction box 27 is assembled, the electrical component 29 is previously accommodated in the electrical junction box 27, and the electrical component 29 is connected to the electrical junction box 27. Therefore, when the electrical junction box 27 is handled in a state in which the electrical junction box 27 is connected to the electrical component 29, it is possible to prevent inconvenience, e.g., prevent the electrical component 29 from coming out from the electrical junction box 27, and the operability when the electrical junction box 27 is mounted to a vehicle can be enhanced.

In the connecting structure 25 of the present embodiment, since the contact portion 31 is formed by bending the terminal 31, it is possible to easily adjust the projecting length of the terminal 31 from the part body 39. Therefore, when the plurality of terminals 31 of the electrical component 29 are connected to laminated bus bars 33 respectively, the longitudinal size of the terminal 31 connected to the lower layered bus bar 33 can be increased so that the terminal 31 can easily be connected to the lower layered bus bar 33, and it is possible to easily meet a complicated circuit.

In the connecting structure 25, the layout flexibility of the plurality of terminals 31 of the relay is enhanced, and it is possible to easily meet a complicated circuit.

Although the electrical component 29 is surrounded by the upper and lower cases together with the bus bar 33 in the state in which the electrical component 29 is connected to the electrical junction box 27 in the above embodiment, any one of the upper and lower cases may be provided with an opening, and in a state in which the electrical component 29 is connected to the electrical junction box 27, the electrical component 29 may project from the opening of the upper or lower case.

The electrical component 29 comprises the relay in the above embodiment, but the present invention may be applied to a condenser or diode.

Although only one bus bar 33 is placed on the insulating plate 43, a plurality of bus bars 33 may be laminated while interposing a plurality of insulating plates 43 therebetween.

Although the bus bar 33 does not have the tab in the above embodiment, the bus bar 33 may be formed with the tab. In this case, the tab of the bus bar 33 is connected to a terminal such as a connector connected to the electrical junction box 27.

What is claimed is:

1. A connecting structure of an electrical component to an electrical junction box, comprising:

a plurality of long terminals extending in a connecting direction of the electrical component to the electrical junction box directly from a part body of the electrical component;

a flat plate-like bus bar which is provided in the electrical junction box to which the electrical component is to be connected, the bus bar being brought into conduction with the plurality of long terminals in a state in which the electrical component is connected to the electrical junction box;

a plurality of contact portions formed by bending tip ends of the plurality of long terminals toward an outer periphery of the electrical component, the plurality of contact portions being formed on front ends of the plurality of long terminals, the plurality of contact portions being contacted with the bus bar in the state in which the electrical component is connected to the electrical junction box; and holding means for holding a contacted state between the plurality of contact portions and the bus bar.

2. A connecting structure of an electrical component to an electrical junction box according to claim 1, wherein the plurality of contact portions are formed by bending the plurality of long terminals in a direction intersecting a projecting direction of the electrical component toward the electrical junction box, end surfaces formed on front ends of the plurality of long terminals in the projecting direction are brought into contact with the outer surface of the bus bar in the state in which the electrical component is connected to the electrical junction box.

3. A connecting structure of an electrical component to an electrical junction box according to claim 1, wherein the holding means is tightly connecting the plurality of contacted portions between the plurality of contact portions and the bus bar in the state in which the electrical component is connected to the electrical junction box.

4. A connecting structure of an electrical component to an electrical junction box according to claim 2, wherein the plurality of contact portions are formed by bending the plurality of long terminals in a direction intersecting a projecting direction of the electrical component toward the electrical junction box, end surfaces formed on front ends of the plurality of long terminals in the projecting direction are brought into contact with the outer surface of the bus bar in the state in which the electrical component is connected to the electrical junction box.

5. A connecting structure of an electrical component to an electrical junction box, comprising:

a plurality of long terminals extending in a connecting direction of the electrical component to the electrical junction box directly from a part body of the electrical component;

a flat plate-like bus bar which is provided in the electrical junction box to which the electrical component is to be connected, the bus bar being brought into conduction with the plurality of long terminals in a state in which the electrical component is connected to the electrical junction box;

a plurality of contact portions formed by bending tip ends of the plurality of long terminals toward an a periphery of the electrical component, the contact portions being formed on front ends of the plurality of long terminals in a connecting direction of the electrical component the electrical junction box, the contact portions being contacted with the bus bar in the state in which the electrical component is connected to the electrical junction box; and holding means for holding a contacted state between the plurality of contact portions and the bus bar, wherein the plurality of contact portions are formed by bending the plurality of long terminals in a direction intersecting a projecting direction of the electrical component toward the electrical junction box, end surfaces formed on front ends of the plurality of long terminals in the projecting direction are brought into contact with the outer surface of the bus bar in the state in which the electrical component is connected to the electrical junction box.

6. A connecting structure of an electrical component to an electrical junction box, comprising:

a plurality of long terminals extending in a connecting direction of the electrical component to the electrical junction box directly from a part body of the electrical component;

a flat plate-like bus bar which is provided in the electrical junction box to which the electrical component is to be connected, the bus bar being brought into conduction with the plurality of long terminals in a state in which the electrical component is connected to the electrical junction box;

a plurality of contact portions formed by bending tip ends of the plurality of terminals toward an outer periphery of the electrical component, the contact portions being formed on front ends of the plurality of long terminals in a connecting direction of the electrical component to the electrical junction box; and holding means for holding a contacted state between the plurality of contact portions and the bus bar, wherein the holding means tightly connects the contact portions and the bus bar, and wherein the plurality of contact portions are formed by bending the plurality of long terminals in a direction intersecting a projecting direction of the electrical component toward the electrical junction box, end surfaces on front ends of the plurality of long terminals in the projecting direction being in contact with the outer surface of the bus bar in the state in which the electrical component is connected to the electrical junction box.

7. A connecting structure of an electrical component to an electrical junction box, comprising:

a plurality of long terminals projecting in a projecting direction toward the electrical junction box directly from a part body of the electrical component, wherein the plurality of long terminals are bent toward an outer periphery of the electrical component to form a plurality of contact portions intersecting the projecting direction, the contact portions being formed on front ends of the plurality of long terminals, the contact portions including surfaces;

a flat plate-like bus bar in the electrical junction box, the bus bar being contacted with the plurality of contact portions such that the surfaces of the contact portions are in contact with the outer surface of the bus bar in a state in which the electrical component is connected to the electrical junction box; and holding means for holding the plurality of contact portions and the bus bar in a contacted state.

* * * * *

UNITED STATES PATENT AND TRADEMARK OFFICE
CERTIFICATE OF CORRECTION

PATENT NO. : 6,619,967 B2
DATED : September 16, 2003
INVENTOR(S) : Hiroyuki Murakoshi It is certified that error appears in the above-identified patent and that said Letters Patent is hereby corrected as shown below:

Column 8,
Line 52, "claim 2," should read -- claim 3, --.

Column 9,
Line 8, "an a periphery" should read -- an outer periphery --.
Lines 11-12, "component the" should read -- component to the --.
Line 35, "component to" should read -- component is to --.

Signed and Sealed this

Seventeenth Day of February, 2004

JON W. DUDAS
*Acting Director of the United States Patent and Trademark Office*